United States Patent [19]

Welty

[11] Patent Number: 4,865,708

[45] Date of Patent: Sep. 12, 1989

[54] MAGNETRON SPUTTERING CATHODE

[75] Inventor: Richard P. Welty, Boulder, Colo.

[73] Assignee: Vac-Tec Systems, Inc., Boulder, Colo.

[21] Appl. No.: 271,100

[22] Filed: Nov. 14, 1988

[51] Int. Cl.[4] ............................................. C23C 14/34
[52] U.S. Cl. ................................ 204/192.12; 204/298
[58] Field of Search ................ 204/192.12, 298 PM, 204/298 ME, 298 CM

[56] References Cited

U.S. PATENT DOCUMENTS

| | | | |
|---|---|---|---|
| 3,878,085 | 4/1975 | Corbani | 204/298 |
| 3,956,093 | 5/1976 | McLeod | 204/192.12 |
| 4,116,806 | 9/1978 | Love | 204/298 |
| 4,162,954 | 7/1979 | Morrison | 204/298 |
| 4,166,018 | 8/1979 | Chapin | 204/192.12 |
| 4,180,450 | 12/1979 | Morrison | 204/298 |
| 4,198,283 | 4/1980 | Class | 204/298 |
| 4,239,611 | 12/1980 | Morrison | 204/298 |
| 4,265,729 | 5/1981 | Morrison | 204/298 |
| 4,282,083 | 8/1981 | Kertesz | 204/298 |
| 4,356,073 | 10/1982 | McKelvey | 204/192.12 |
| 4,391,697 | 7/1983 | Morrison | 204/298 |
| 4,401,539 | 8/1983 | Abe et al. | 204/192.13 |
| 4,428,816 | 1/1984 | Class | 204/298 |
| 4,434,037 | 2/1984 | Crank | 204/192.12 |
| 4,437,966 | 3/1984 | Hope | 204/298 |
| 4,441,974 | 4/1984 | Nishikawa | 204/192.12 |
| 4,444,643 | 4/1984 | Garrett | 204/298 |
| 4,448,653 | 5/1984 | Wegman | 204/298 |
| 4,461,688 | 7/1984 | Morrison | 204/298 |
| 4,472,259 | 9/1984 | Class | 204/298 |
| 4,486,287 | 12/1984 | Fournier | 204/192.12 |
| 4,486,289 | 12/1984 | Parsons | 204/298 |
| 4,500,409 | 2/1985 | Boys | 204/298 |
| 4,572,776 | 2/1986 | Aichert | 204/298 |
| 4,601,806 | 7/1986 | Wirz | 204/298 |
| 4,610,774 | 9/1986 | Sakata et al. | 204/298 |
| 4,652,358 | 3/1987 | Deppisch et al. | 204/298 |

FOREIGN PATENT DOCUMENTS

| | | | |
|---|---|---|---|
| 61-272373 | 12/1986 | Japan | 204/298 |
| 62-263965 | 11/1987 | Japan | 204/298 |
| 62-263966 | 11/1987 | Japan | 204/298 |
| 63-157866 | 6/1988 | Japan | 204/298 |

Primary Examiner—Aaron Weisstuch
Attorney, Agent, or Firm—Holme Roberts & Owen

[57] ABSTRACT

A superior method and magnetron sputtering cathode apparatus in which some of the flux lines forming the closed-loop magnetic tunnel are made to change their curvature from convex to slightly concave within a region of the tunnel intersecting the sputtering target volume, and over a substantial fraction of the tunnel width. The improved field shape reduces the tendency of the eroded area of the target to become narrower as erosion progresses, and thereby allows more complete consumption of the target.

19 Claims, 6 Drawing Sheets

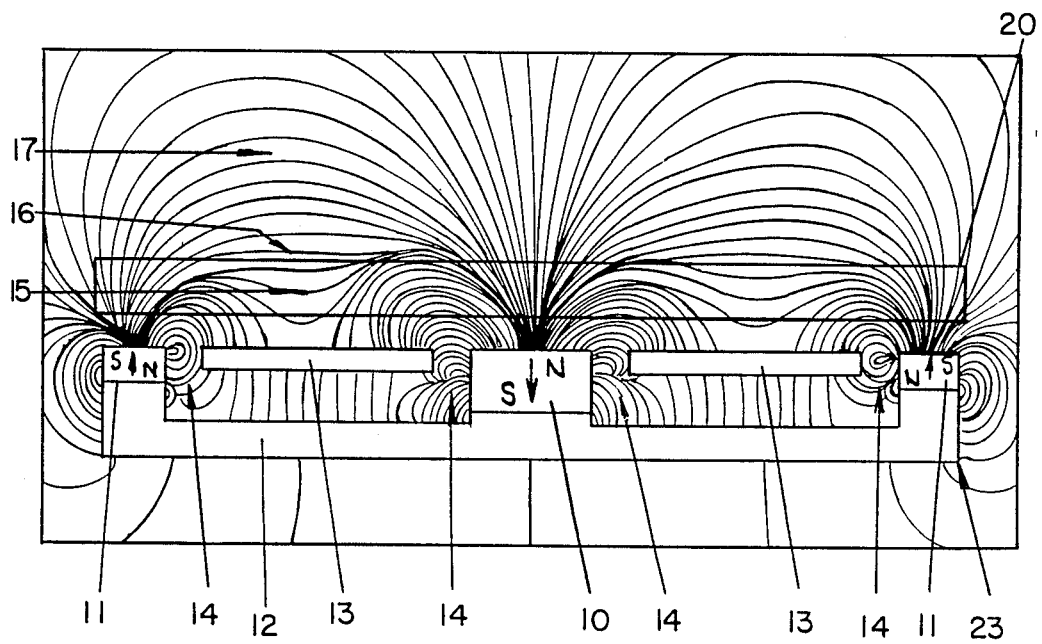
FIGURE 1
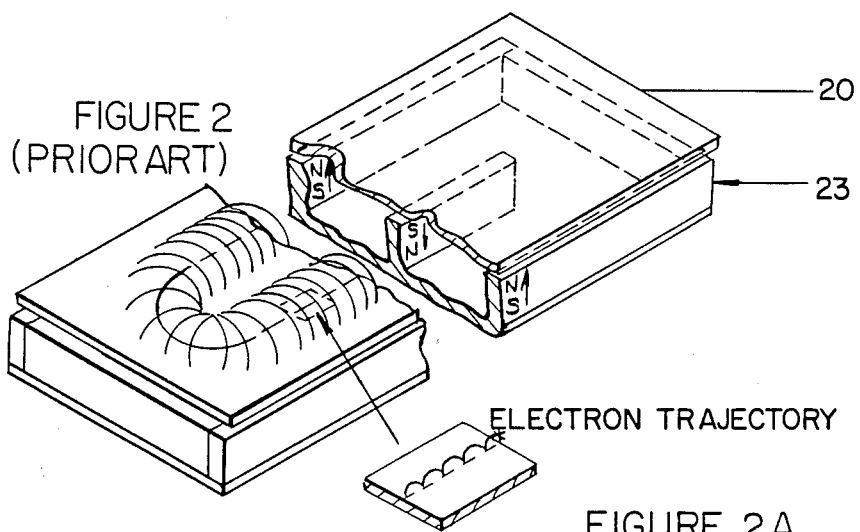
FIGURE 2
(PRIOR ART)
FIGURE 2A
(PRIOR ART)

MAGNETRON SPUTTERING CATHODE

FIELD OF THE INVENTION

The present invention relates to an improved method and magnetron sputtering cathode apparatus for obtaining superior results in magnetron sputtering processes.

BACKGROUND OF THE INVENTION

Sputtering Processes.

Magnetron sputtering is widely used for the deposition of thin films of various metallic and ceramic materials in production and laboratory applications. The cathode is mounted in a vacuum chamber, and is eroded on one of its surfaces by a DC or RF plasma discharge confined in close proximity to its surface by a closed loop magnetic tunnel. The eroded surface of the cathode is called the target, and is generally easily replaceable.

The target (typically a plate of the material to be deposited or the material from which a film is to be synthesized) is connected to the negative side of a DC power supply (or to an RF power supply). The positive side of the power supply may be connected to the vacuum chamber (if metal), or to a separate anode structure. The substrate is the object to be coated, and is placed or moved in front of the target and within several centimeters of it. The substrate may be electrically grounded, floating or biased, and may be heated, cooled, or some combination of these. An inert gas is introduced to provide a medium in which a glow discharge can be initiated and maintained. The most common sputtering gas is argon.

When the glow discharge is started, positive ions strike the target plate and remove mainly neutral target atoms by momentum transfer, and these condense on the substrate to form thin films. There are, in addition, other particles and radiation produced at the target and in the plasma (secondary electrons and ions, desorbed gases and photons) all of which may affect film properties. It is desirable that the plasma density in the discharge be uniform over as much of the target surface as possible, in order to erode the largest possible fraction of the target volume. The plasma discharge is sustained by ionization of the sputtering gas, primarily by secondary electrons emitted from the target surface due to bombardment by positive gas ions and photons from the plasma. These electrons are trapped by the magnetic field, which in the prior art has the shape of a convexly arched tunnel, forming a closed loop on the front target surface and within the target volume, and which increases the ionization efficiency of the discharge current.

In some cases, gases or gas mixtures other than Ar are used. Usually this involves some sort of reactive sputtering process in which a compound is synthesized by sputtering a metal target (e.g., Ti) in the presence of a reactive gas (e.g., in an Ar-$O_2$ mixture) to form a compound of the metal and the reactive gas species (e.g., $TiO_2$)

The magnetic fields described in the prior art may be created by fixed or moving permanent magnets or electromagnetic coils. Generally, the field is created by placing magnets behind the back surface of the target, with their magnetization oriented perpendicular or parallel to the target surface, such that the resultant magnetic field above the magnets, and in the area of the target, is a convexly arched tunnel. Except for those portions of the magnetic field where the tangent to the flux lines is perfectly parallel or perpendicular to the target surface, at each position above the plane of the magnets the magnetic field has a parallel (to the target surface) and perpendicular (to the target surface) component.

The electric field due to the applied voltage (or the DC offset voltage in the case of an RF discharge) acting in combination with the parallel magnetic field component, causes the electrons to gain a net velocity along the magnetic tunnel in the direction given by the ExB drift (as it is commonly referred to in the field of plasma physics). By shaping the magnetic means in a circular or racetrack shape, the electrons will travel in a continuous loop above the surface of the target, colliding with and ionizing the gas atoms present near the target surface. The shape of the electron path defines the portion of the target that will be sputtered and therefore eroded. The required magnetic flux density is generally greater than about 200 gauss at the target surface in the center of the tunnel, for the parallel magnetic field component.

The interaction of this velocity along the tunnel with the tunnel magnetic field causes another force on the electrons, in the direction perpendicular to both the magnetic flux lines and the velocity ($-V \times B$). The component of this force due to the parallel magnetic field component pushes the electrons toward the target, confining them in the direction perpendicular to the target surface.

The perpendicular magnetic field component, however, interacts with the velocity along the tunnel to produce lateral forces on the electrons, parallel to the target surface and perpendicular to the path of travel. In a conventional convexly arched tunnel, these lateral forces "pinch" the electrons toward the center of the tunnel from both sides. This pinching causes the plasma density and therefore the sputtering erosion to be highest at the center of the tunnel. As the sputtering erosion proceeds into the target volume, the magnetic field at the bottom of the erosion groove, and in particular its perpendicular component, becomes increasingly stronger, causing stronger pinching and resulting in an erosion groove in the target which is typically V-shaped. The fraction of the target volume which has been vaporized by the time the bottom of the erosion groove reaches the back of the target, called the target utilization, is rather low (typically around 30%) for a conventional magnetron sputtering cathode apparatus.

Numerous efforts have been made to improve target utilization. U.S. Pat. No. 4,162,954 and 4,180,450 of Morrison improve utilization by flattening the curvature of the convexly arched field lines forming the magnetic tunnel. Other prior art designs involve more mechanical and/or electrical complexity than a simple permanent magnet assembly and flat plate sputtering target. U.S. Pat. No. 3,956,093 of McLeod enlarges the area over which erosion occurs by shifting the location of the center of the erosion groove in an oscillatory fashion, by application of a variable magnetic bias field to the static, convexly arched magnetron field, using an electromagnet coil. U.S. Pat. No. 4,444,643 of Garrett similarly enlarges the center of the erosion groove by physically moving the entire magnet assembly. U.S. Pat. No. 4,198,283 of Class, et al. describes a method of improved utilization using multiple target segments, with a special cross sectional shape, and using a convexly arched magnetic tunnel within the target volume.

Despite the extensive attention that has been focused on efforts to improve target utilization, significant improvements have been obtained only at the expense of additional electrical or mechanical complexity. Although spent targets may be reworked into new targets or salvaged, any significant increase in target utilization translates into substantial cost savings. In addition, increased target utilization enables longer production runs and less downtime spent in replacing targets.

None of the prior art efforts to increase target utilization have recognized the importance or possibility of utilizing magnetic tunnel fields containing concave flux lines—regions in which the perpendicular magnetic field component is directed such that the lateral forces on the trapped electrons push them away from the center of the tunnel, rather than pinching them toward it—in the area of the target. Consequently, although target utilization improvements have created spent targets with broader V-shaped erosion grooves, they have previously been unable to create broad flat regions of target erosion by the use of a simple static magnetic tunnel field.

SUMMARY OF THE INVENTION

The present invention describes a method for increasing the target utilization of magnetron sputtering cathodes, resulting in improved economy of the deposition process, while maintaining mechanical and electrical simplicity of the magnet assembly and target. In the present invention, the magnetic flux lines projected into the target region form a closed loop tunnel which has a concave shape at locations in the center region of the tunnel, immediately in front of the magnet assembly. With increasing distance from the magnet assembly, the flux lines in the center region of the tunnel become flat and parallel to the plane of the target surface over a substantial fraction (20-50%) of the tunnel width. With further increasing distance, the flux lines become convex in curvature all across the tunnel width. The front surface of the sputtering target may be located in the region where the flux lines are flat and parallel to the target plane. The target volume then intersects the region in the center of the tunnel where the flux lines are concave over a wide area.

In the method of the present invention and utilizing a magnetron sputtering cathode apparatus as disclosed herein, sputtering erosion begins at the front surface of the target, where the flux lines are flat and parallel to the surface. There is, therefore, over a wide area in the center of the tunnel, little or no perpendicular magnetic field component to create lateral forces on the electrons. The trapped electrons circulating in the tunnel, and thus the area in which ionization and erosion are concentrated, therefore spread out over a wide area of the tunnel. The electrons are laterally confined only by the perpendicular magnetic field component at the outer edges of the tunnel. As the sputtering erosion proceeds into the target, the concave field lines beneath the original target surface gradually become exposed. The perpendicular magnetic field component on each side of the tunnel centerline in the concave region is opposite in direction to the perpendicular component at the inner and outer edges of the tunnel (where the curvature of the lines is convex). In the concave region, the -VxB lateral force on the electrons actually tends to spread them away from the center of the tunnel, thus eliminating the plasma pinching effect which dominates the erosion process in a conventional magnetron cathode. Since the perpendicular magnetic field component is weak relative to the parallel magnetic field component in the concave region, the spreading force is small and is effectively nullified by the tendency of plasma to expand. This improved magnetic field shape results in an erosion groove having a wide flat bottom, with greatly improved target utilization of 45-60%.

BRIEF DESCRIPTION OF THE DRAWINGS

FIG. 1 shows a cross section through the linear portion of a rectangular magnetic module and target according to one embodiment of the present invention, and a plot of the magnetic flux lines.

FIG. 2 shows schematically the magnetic assembly and target of a rectangular planar magnetron cathode according to one prior art, with magnetic flux lines projecting through the target and forming a closed loop tunnel.

DETAILED DESCRIPTION OF THE PREFERRED EMBODIMENTS

Figure 3:
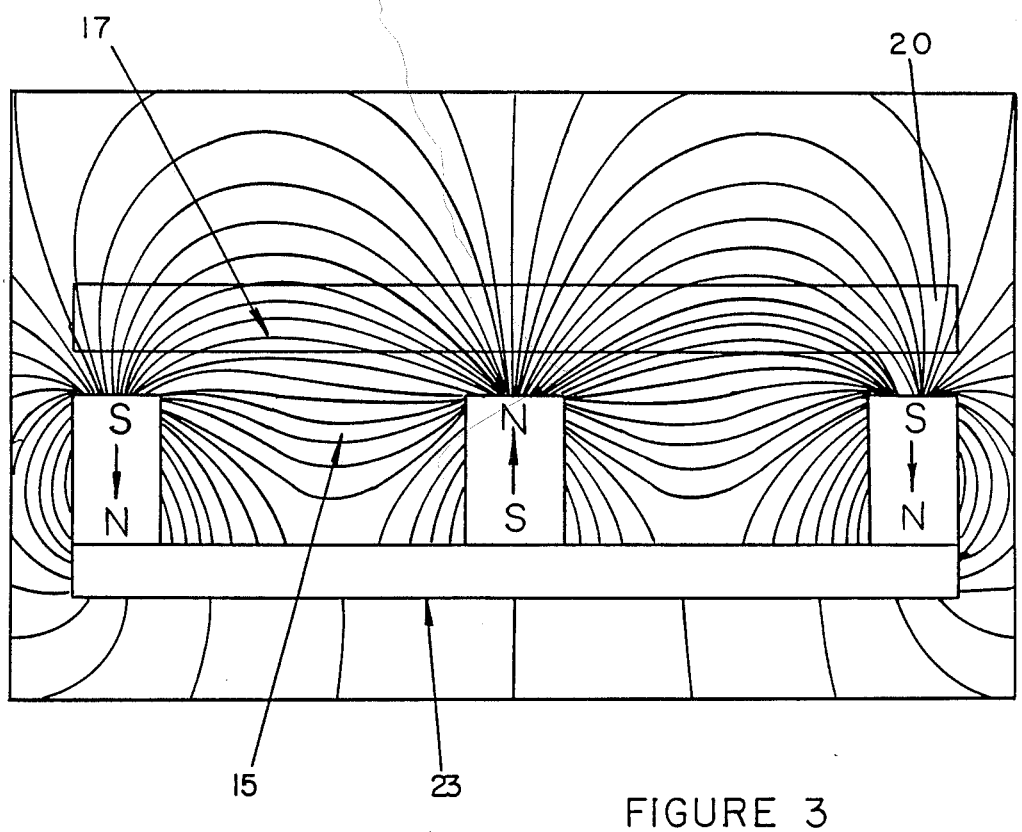
FIG. 3 shows a cross section of the linear section of the magnetic assembly and target through the prior art device shown in FIG. 2, with a plot of the magnetic flux lines.

Magnetron sputtering cathodes are commonly made with targets in the form of flat circular or rectangular plates. The magnetic tunnel shape for a circular target may be a simple circular ring. The magnetic tunnel shape for a rectangular target may consist of two parallel linear sections, parallel to and extending along most of the target length, and joined at each end by a semicircular section, thus forming a continuous loop in the shape of a flattened oval "racetrack." Means for mounting and cooling the target, vacuum sealing, electrical connections, etc. are well known in the art and are not shown in the figures.

The direction, curvature, and density of magnetic flux lines generated by a given cathode may be easily determined from measurements made using a commonly available instrument, the gaussmeter (magnetic flux density meter). The term "magnetic flux lines" refers to imaginary lines which are continuous and everywhere parallel to the vector magnetic field, and therefore serve as a convenient description of its shape. The plane of reference for the terms convex and concave in the preceding and following descriptions is on the side of the generating magnetic assembly which is adjacent to the target, with the magnets lying behind this plane and the target lying in front of the plane and parallel to it.

The plots of magnetic flux lines shown in the Figures were generated by a finite element computer modeling program. Several programs capable of performing this type of analysis are commercially available and generally known to those skilled in the art. The spacing between flux lines is inversely proportional to the magnetic flux density (field strength), i.e. the stronger the field, the closer the line spacing. Flux lines inside the magnetic members are not shown, so the construction may be more easily seen.

The shape of the tunnel magnetic field in the present invention may be considered to be determined by the superposition (vector addition) of the fields due individually to the magnetic poles at the inner and outer edges of the tunnel, and the fields due to the magnetization induced in the permeable materials in the assembly. In the present invention, the magnetomotive force developed at the inner and outer poles is balanced, such that a region exists over a wide area in the center of the tunnel where the field component perpendicular to the target plane equals zero (i.e., the field is flat and parallel to the target plane), due to mutual cancellation of the perpendicular field components of each pole separately.

In preferred embodiments of the invention, the width of the flat field region is maximized, and the curvature in the concave region minimized, by locating a segment of magnetically permeable material between the two poles, and forming a continuous loop along the magnetic tunnel, between the concentric poles. Gaps exist between the permeable segment and each pole, with the magnetic fringing fields from the two concentric gaps combining to form the tunnel field. The magnetomotive force developed across the inner and outer gaps may be balanced by controlling the size and shape of the magnets, and the width and geometry of the gaps.

All of the drawings shown are of planar magnetron sputtering cathodes, i.e., cathodes with targets possessing a planar (flat) erosion surface. However, the method for improved sputtering disclosed herein may equally be applied to non-planar devices.

Figure 5:
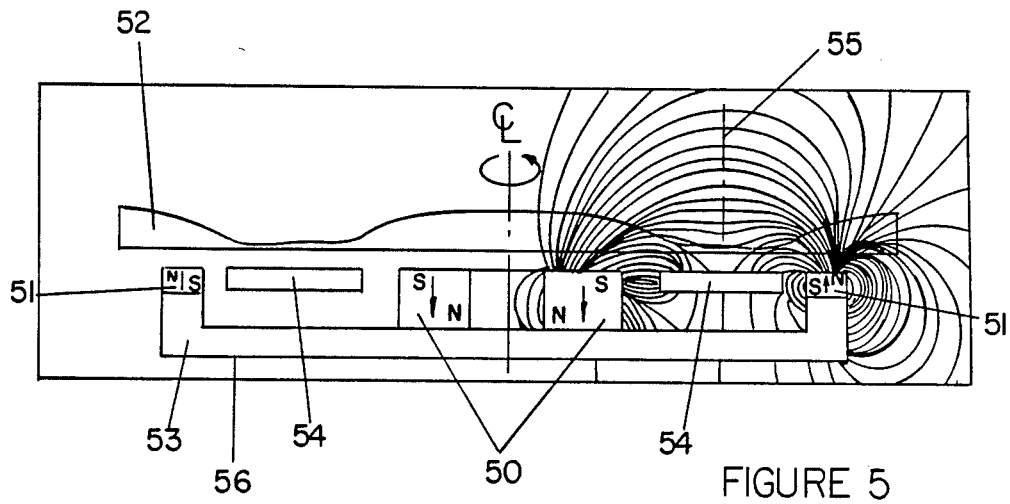
FIG. 5 shows a tracing of the cross section of an actual 5" diameter round target eroded using an embodiment of the present invention superimposed on a plot of the flux lines generated by this design.

One embodiment of a rectangular cathode according to the present invention is shown in FIG. 1. The magnet geometry, target location, and magnetic flux lines in a cross section through the linear portion of a cathode assembly are shown. The permanent magnets 10 and 11 are disposed in three rows parallel to the long direction of the rectangular target 20, with one row 10 at the center of the target, forming the inner pole for both of the parallel linear tunnel sections, and the outer two rows 11 at the outer edges of the tunnel sections. All magnets are oriented with magnetization perpendicular to the target plane, with the same polarity for the two rows of magnets 11 at the outer tunnel edges, and with the center row of magnets 10 of opposite polarity to the outer rows. The ends of the magnets 10, 11 which face away from the target 20 are connected by a magnetically permeable pole piece 12, with no gap between these ends and the pole piece 12. Another segment of magnetically permeable material 13 is disposed behind and parallel to the target 20, forming a continuous path along the tunnel loop, between the magnetic poles, with gaps 14 between the permeable segment and each pole. The ends of the linear double-tunnel section may be joined so as to form a continuous oval tunnel by semicircular end sections, each comprising half of a circular magnet assembly as shown in FIG. 5. The magnetically permeable segments 13 between the poles in the linear and semi-circular sections are joined or located adjacently, so as to form a magnetically continuous structure along the entire closed loop magnetic tunnel. The permeable segments 13 may differ in cross sectional area between linear and semicircular sections so as to maintain the balance between inner and outer poles in each of the sections.

As illustrated by the magnetic flux lines seen in FIG. 1, the existence of a region of concave curvature 15 in the center of the tunnel, and the orientation of the target 20 within this magnetic field define the crucial elements of the present invention. The magnet assembly 23 is located on the side of the target 20 opposite from the surface that is being sputtered. The magnet assembly 23 generates a magnetic field, composed of or represented by magnetic flux lines, that form a closed-loop magnetic tunnel adjacent to the front surface of the target as seen in FIGS. 1 and 2. The curvature of the magnetic flux lines changes progressively wit increasing distance from the magnet assembly, from concave 15, to flat 16, to convex 17. The region where the flux lines are flat 16 is substantially at the front surface of the target 20, and is substantially parallel to the target surface. The width of the flat portion 16 of the "flat" flux lines constitutes at least 20% of the total width of the magnet assembly 23. In preferred embodiments of the invention, the flat region 16 may be as much as 40–50% of the width of the magnet assembly 23. The region above the magnet assembly 23 where the flux lines are concave 15 is located substantially within the body of the target 20.

As can be seen from the various embodiments shown here, any number of target and magnet assembly configurations may give rise to the desired magnetic field shape and orientation of the target within the field. The method of this invention relates to an improvement in the magnetron sputtering process wherein a glow discharge plasma is magnetically confined to a region adjacent to and above the target by utilizing a magnetic field as described herein.

Another embodiment of a rectangular cathode similar to FIG. 1 (not shown) can be made by dividing the center row of magnets 10 in the linear section into two rows of the same polarity, with a space between these two rows in which, for example, a structural member of the cathode could be located.

In order to emphasize the differences between the present invention and the methods used and described in the prior art, the magnetic field lines in a prior art device are shown in FIG. 3. Although a region in which the flux lines change curvature from convex 17 to concave 15 may be seen, the concave region 15 is not inside the target 20 volume, nor are the flux lines parallel to the target plane or near the target surface, in the region there they have zero curvature.

The difference between the prior art and the method of the present invention is further illuminated by the drawing shown in FIG. 4. For both a prior art device and for an embodiment of the present invention, the drawing indicates the direction of the lateral forces acting on the electrons due to a single typical flux line. The superposition of a large number of flux lines, whose shape changes gradually from place to place, comprises the magnetic tunnel. The forces acting on an electron at a particular location are determined by the field shape and strength at that location. In the prior art, the lateral force near the center of the tunnel is acting to pinch the electrons inwardly, thus narrowing the plasma glow area above the target surface. In the method of the present invention, the lateral force component is acting to spread the electrons away from the centerline of the magnetic field tunnel.

Figure 4A:
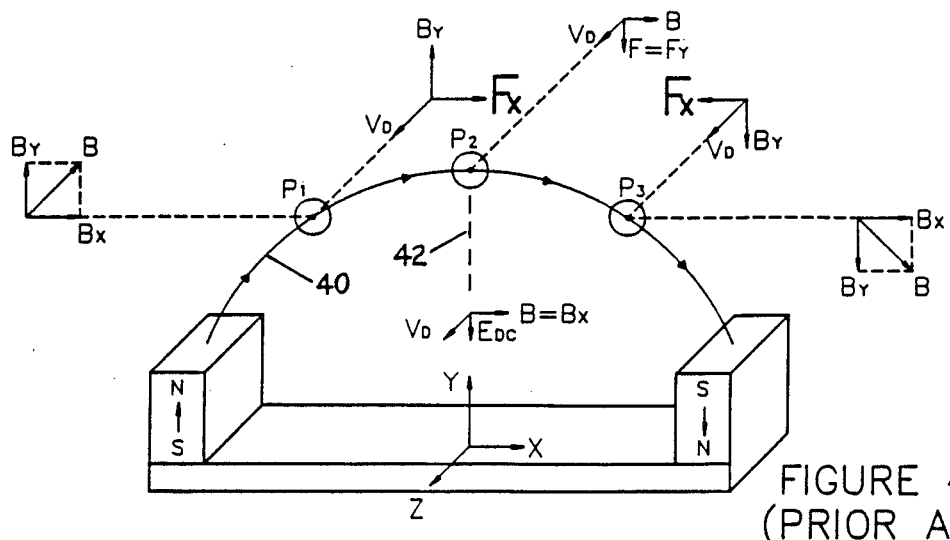
FIG. 4 shows a schematic illustration of flux lines from cross sections of (a) a convexly arched magnetic tunnel according to prior art, and (b) a magnetic tunnel according to the present invention, having concave curvature. Forces on the trapped electrons are indicated.
Figure 4B:
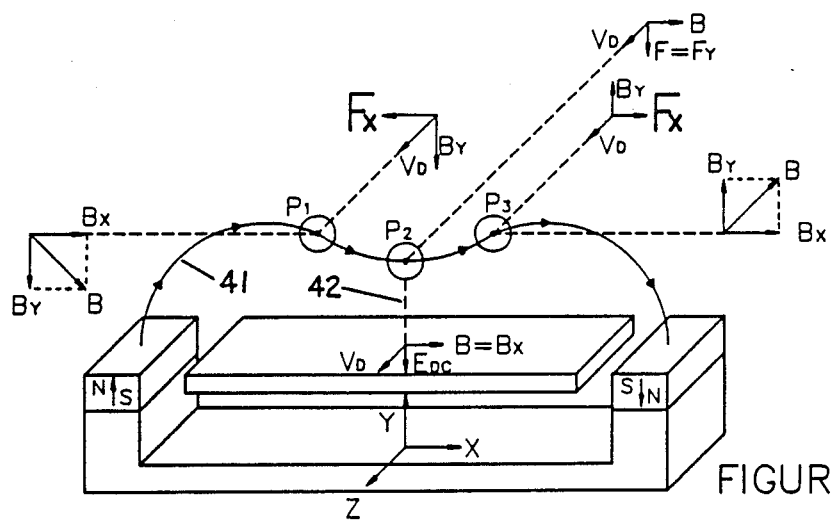

FIG. 4a shows a flux line 40 with convex curvature, representative of the field shape present within and in front of the target 20 in a magnetron of the prior art. FIG. 4b shows a flux line 41 with concave curvature, representative of the field shape present inside the body of the target in a magnetron of the present invention. Referring to both figures, P1 and P3 are points in the central region of the tunnel, to the left and right of the tunnel centerline 42 respectively, while P2 is a point on the centerline 42 of the tunnel. The target locations within the tunnel fields are such that each of these points will be adjacent to the erosion surface of the target 20 at some time during the erosion of the target 20. The original target surface is parallel to the XZ plane according to the coordinate system indicated. At point P2, in both FIGS. 4a and 4b, the magnetic field has only a component parallel to the target surface, indicated as Bx. The electric field at the target surface is substantially in the $-Y$ direction, due to the polarity of the applied voltage, causing an ExB drift velocity, Vd, in the $+Z$ direction along the tunnel. The vector force F refers to the $-VdxB$ force on the circulating electrons, and is in both cases in the $-Y$ direction at the tunnel centerline 42, thus confining the plasma to the target surface.

The essence of the present invention lies in the difference in direction of the lateral components Fx of this force in the central region of the tunnel. In FIG. 4a, the lateral forces Fx on the electron are in the direction toward the center of the tunnel on both sides, at points P1 and P3, thus pinching the circulating electrons toward the center of the tunnel. In FIG. 4b, the lateral forces Fx are in the direction away from the center on both sides, at P1 and P3, thus tending to spread the electrons away from the center of the tunnel, and allowing erosion over a much wider area.

The method of the present invention, wherein the magnetic field lines have a concave region in the area of the body of the target, is adaptable to any number of target shapes and magnet configurations. FIG. 5 shows the magnet geometry, target location, and magnetic flux lines in a cross section through one embodiment of a round cathode according to the present invention. The permanent magnets 50, 51 are oriented with magnetization perpendicular to the target plane, and disposed in two concentric rings 50, 51 at the inner and outer edges of the magnetic tunnel, with polarities opposite in the two rings 50, 51. The magnets are joined at the pole faces away from the target 52 by a magnetically permeable pole piece 53. A segment of magnetically permeable material 54 is disposed in a continuous loop along the magnetic tunnel between the inner 50 and outer 51 magnetic poles and parallel to the target 52, forming a continuous loop between the magnetic poles, and creating gaps between the permeable segment 54 and each pole 50, 51.

By selecting the proper magnetic strengths, distances from the target and from the centerline 55, amount and spacing of the magnetically permeable material 54, and size of the gaps between the magnets 50, 51 and the permeable material 54, the desired magnetic field characteristics of this invention may be obtained. Such selection can be aided by computer modeling experiments. There are several commercially available programs capable of performing this task.

One preferred embodiment of the present invention is shown in FIG. 5. The drawing of FIG. 5 is to accurate scale (as are the other drawings) for the 5" diameter target 52 shown. The diameter of the permeable pole piece 53 is 4.38 inches. The annular permeable segment 54 has an inside diameter of 2.0 inches, an outside diameter of 3.56 inches, and a thickness of 0.12 inches. The material for the permeable pole piece 53 and annular segment 54 is low carbon steel. The inner magnet ring 50 has an inside diameter of 0.5 inches, an outside diameter of 1.5 inches, and a thickness of 0.38 inches. The outer magnet 51 ring has an inside diameter of 3.88 inches, an outside diameter of 4.38 inches, and a thickness of 0.16 inches. The magnet material is commercially available neodynium-iron-boron, grade 35. The strength of the parallel magnetic field component at the target surface in the center of the tunnel field is approximately 400 gauss.

Figure 6:
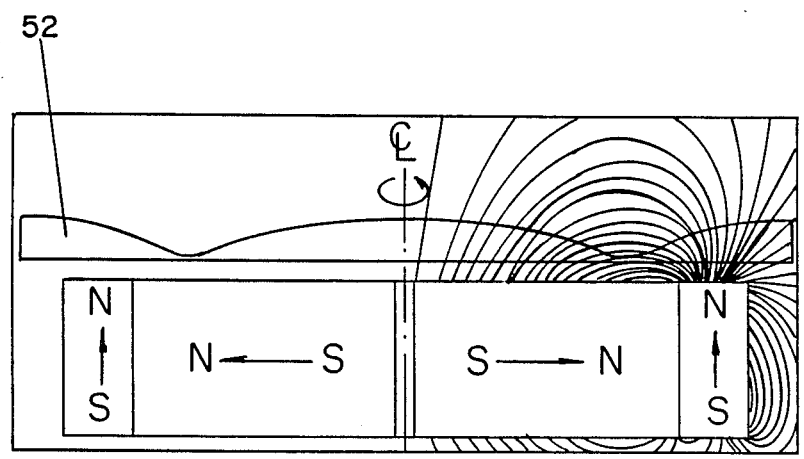
FIG. 6 shows a tracing of the cross section of an actual 5" diameter round target eroded using a prior art (Morrison) magnetic design, superimposed on a plot of the flux lines generated by this design.

The drawings in FIGS. 5 and 6, in addition to depicting the magnetic field lines for circular target 52 and magnetic assemblies 56 for the present invention and the prior art, show a tracing of the actual results obtained by employing the magnetic fields illustrated. As can be seen in these figures, the erosion profile of the target 52 surface is dramatically affected by the shape of the magnetic field lines at the surface and within the body of the target. The prior art utilization of exclusively convex field lines will always result in V-shaped erosion patterns without any substantial broad areas as shown in the result from an embodiment of the present invention. For the target 52 shown in FIG. 5, 48% of the original target volume was eroded, while the target 52 eroded pursuant to the prior art, FIG. 6, was 33% eroded. The present invention in this case provides a 45% increase in target utilization.

Figure 7:
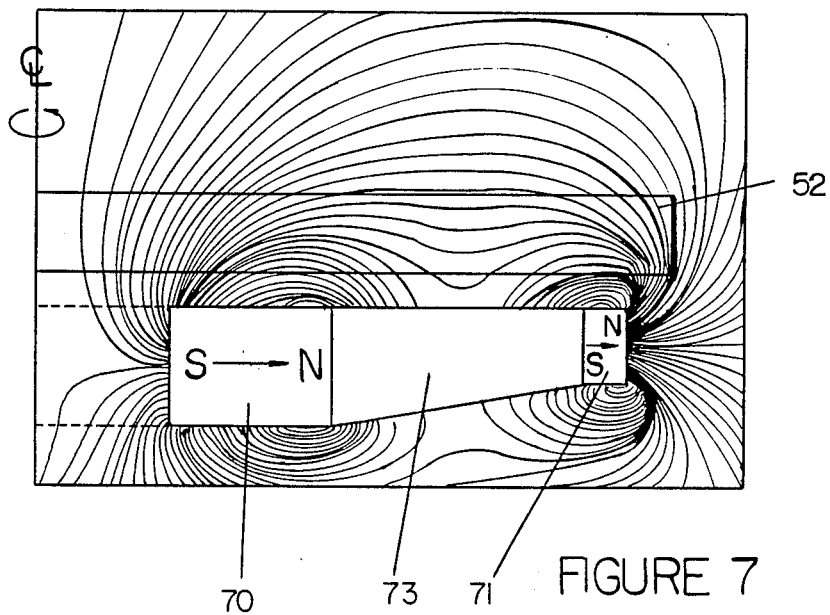
FIG. 7 shows a cross section through a circular magnetic module and target according to another embodiment of the present invention, with the magnetic poles oriented parallel to the target, and a plot of the magnetic flux lines generated.

In FIG. 7, the magnet geometry, target location, and magnetic flux lines in a cross section through another embodiment of a round cathode according to the present invention are illustrated. The permanent magnets 70, 71 are disposed in two concentric rings at the inner and outer edges of the magnetic tunnel, oriented with magnetization parallel to the target plane and parallel to the radii of the target 52, and with the same polarity in both rings 70, 71. The magnets 70, 71 are connected between pole faces which face toward the center of the tunnel by a magnetically permeable segment 73 which forms a continuous ring between the magnets 70, 71, such that no gaps occur between these inner poles and the permeable segment 73. The gaps which create the concentric fringing fields, and which combine to form the magnetic tunnel, exist between the permeable segment 73 and the magnet pole faces at the inner and outer edge of the tunnel, which are not in contact with the permeable segment 73. The magnetomotive force developed across the inner and outer gaps may be balanced in this embodiment by adjusting the area and thickness of the magnets 70, 71.

Figure 8:
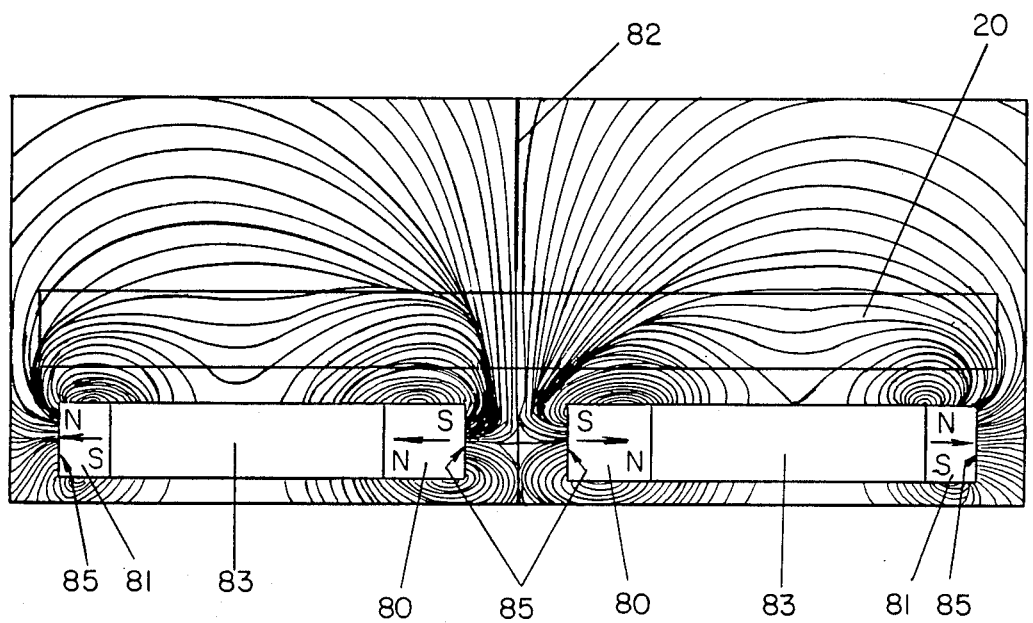
FIG. 8 shows a cross section through the linear portion of a rectangular magnetic module and target according to another embodiment of the present invention, with the magnetic poles oriented parallel to the target, and a plot of the magnetic flux lines generated.

The magnet geometry, target location, and magnetic flux lines in a cross section through the linear section of another embodiment of a rectangular cathode are depicted in FIG. 8. The permanent magnets 80, 81 in this embodiment are disposed in four rows parallel to the long direction of the rectangular target 20, at the inner and outer edges of the magnetic double-tunnel, oriented with magnetization parallel to the target 20 plane and perpendicular to its long direction, and with the same polarity in both magnets 80, 81 on each side of the longitudinal centerline 82 of the target, but with opposite polarity between the sides. The magnets 80, 81 are connected between the ends which face toward the center of the tunnel by a magnetically permeable segment 83 which forms a continuous ring between the magnets, such that no gaps occur between these inner poles 80 and the permeable segment 83. The gaps which create the concentric fringing fields, which combine to form the magnetic tunnel, exist between the permeable segment 83 and the magnet pole faces 85 which are not in contact with the permeable segment 83. The magnetomotive force developed across the inner and outer gaps may be balanced by adjusting the area and thickness of the magnets 80, 81. The ends of the linear double-tunnel section may be joined so as to form a continuous oval tunnel by semicircular end sections, each comprising half of a circular magnet assembly as shown in FIG. 7. The magnetically permeable segments 83 disposed between the poles 80, 81 in each section are joined or located adjacently, so as to form a magnetically continuous structure along the entire closed loop magnetic tunnel. The permeable segments 83 may differ in cross sectional area between linear and semicircular sections so as to maintain the balance between inner 80 and outer 81 poles in each section.

In the preferred embodiments of the invention that utilize permanent magnets, rare-earth magnetic materials are used (samarium-cobalt or neodynium-iron-boron). Such materials have the highest magnetic energy density currently available. The use of these materials makes it possible to generate a given field strength using a much smaller magnet volume than is possible using other known magnetic materials, thus allowing the poles to be spaced further apart for a given target size.

Figure 9:
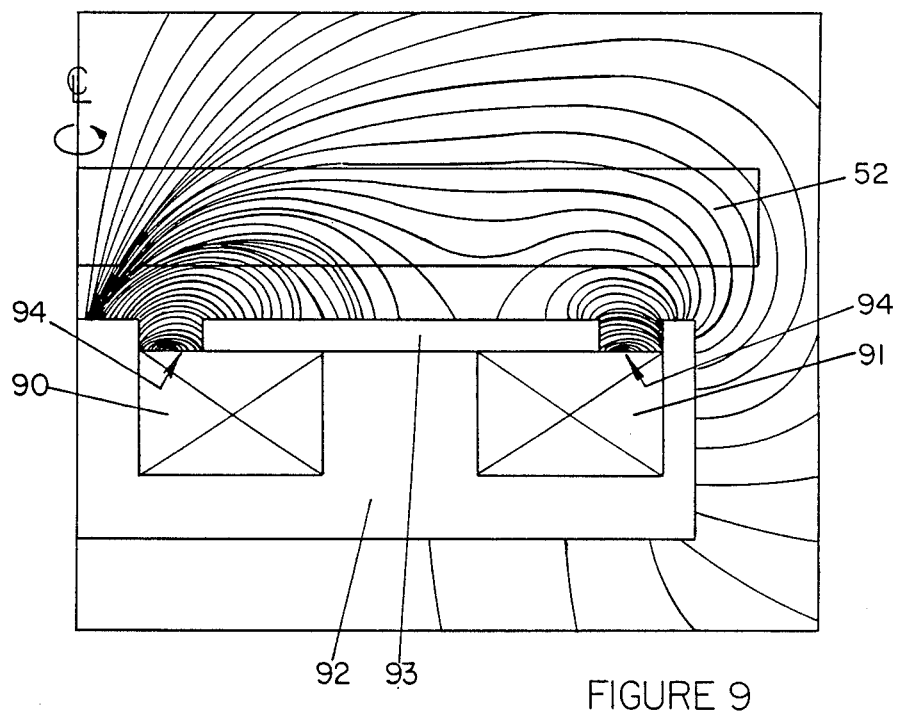
FIG. 9 shows a cross section of a round magnetic module and target according to another embodiment of the present invention, using one electromagnet coil, and a plot of the magnetic flux lines generated.

FIG. 9 shows a cross section of an alternative embodiment of a round magnetron sputtering cathode, in which the magnetic field is generated by the superposition of the fringing fields from two concentric circular electromagnet coils 90, 91, with pole pieces 92 configured so as to form gaps in the magnetic circuit at the inner and outer edges of the magnetic tunnel. A segment of permeable material 93 is disposed between the two coils 90, 91 and parallel to the target 52 surface, and may be attached to, or be a part of, the pole assembly 92 containing the two coils. The electrical current is in the same direction in both coils 90, 91. The number of wire turns and the magnitude of the current in each coil 90, 91, and the size and shape of the pole gaps 94, may be chosen to balance the magnetomotive forces developed at the inner and outer radii of the tunnel in order to create the magnetic field of the present invention.

Figure 10:
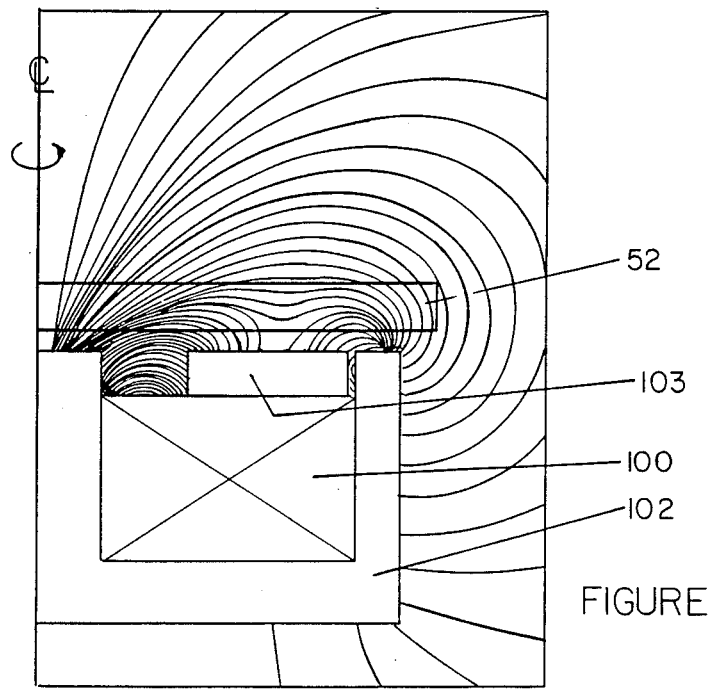
FIG. 10 shows a cross section of a round magnetic module and target according to another embodiment of the present invention, using electromagnet coils, and a plot of the magnetic flux lines generated.

FIG. 10 shows a cross section of an embodiment similar to that in FIG. 9, but utilizing a single electromagnet coil 100. A segment of permeable material 103 is disposed parallel to the target 52, partially covering the coil 100, and forming gaps with the center and outer members of the permeable pole piece 102 in which the coil 100 is mounted. The width and area of the inner and outer gaps may be chosen to balance the magnetomotive forces developed at the inner and outer radii of the tunnel in order to create the magnetic field of the present invention.

The disclosed embodiments of the present invention that have been disclosed in detail are merely for illustrative purposes. The present invention is not limited in its application to the details of the particular arrangements shown, since the invention is capable of other embodiments. Also, the terminology used herein is for the purpose of description and not of limitation.

I claim:

1. A magnetron sputtering cathode consisting of target means and magnet means; said target means having a front surface, a body and a back surface; said magnet means having a front surface and a back surface, said magnetic means front surface being located adjacent to the back surface of said target and generating magnetic flux lines which form a closed-loop magnetic tunnel adjacent to said front surface of said target and within said target body; the curvature of said magnetic flux lines in the center of said tunnel changing progressively from concave, to flat, to convex with increasing distance from said magnet means; in the region where said magnetic flux lines are flat, the flat area is at least 20% of the width of said magnet means, is substantially parallel to said target, and is located substantially at said front surface of said target; and in the region where said magnetic flux lines are concave, said concave area is located substantially within said target body.

2. A magnetron sputtering cathode as in claim 1; said magnetic means comprising two magnetic poles of opposite polarity, and a segment of magnetically permeable material disposed between said magnetic poles; said magnetic means forming a magnetically continuous loop along said tunnel and between said magnetic poles; and with the magnetomotive force developed at each of said magnetic poles being balanced with respect to each other.

3. A magnetron sputtering cathode as in claim 2; said target being a circular disc; said magnet poles each being two concentric rings of one or more permanent magnets; said rings magnetized in a direction perpendicular to said target; said inner and outer rings being magnetically polarized in opposite directions; a magnetically permeable pole piece being attached to said rings on said back surface of said magnet means; and an annular segment of magnetically permeable material disposed between said magnet poles, a gap existing between each of said magnet poles and said annular segment.

4. A magnetron sputtering cathode as in claim 2; said target being rectangular; said magnet means comprising permanent magnets with magnetization oriented, perpendicular to said target; said magnetic means including a linear center section and two end sections, in which said linear section is aligned along the length of said target; said linear section consisting of a plurality of magnets of one polarity orientation disposed along the edges of said magnetic means, and at least one magnet of the opposite polarity disposed behind the center of said target; all of said magnets attached to a magnetically permeable pole piece joining the poles on said back surface of said means magnet; said magnet means forming two parallel magnetic tunnels of opposite polarity, one on each side of the longitudinal centerline of the rectangular target; and two segments of magnetically permeable material disposed between said magnet poles, forming a gap between each of said poles and said permeable segments.

5. A magnetron sputtering cathode as in claim 4; said magnet means including two semicircular magnet end sections and two semicircular magnetically permeable segments disposed between said semicircular magnets, being joined or adjacent to said linear section so as to form a magnetically continuous structure.

6. A magnetron sputtering cathode as in claim 2; said target being circular; said magnet means comprising inner and outer concentric rings of one or more magnets, and magnetization in both of said rings oriented parallel to said target and parallel to the radii of said target; said rings magnetized along said radii to form a circular closed-loop magnetic tunnel; and an annular pole piece of magnetically permeable material disposed between said rings and in contact with said inner ring.

7. A magnetron sputtering cathode as in claim 2; said target being rectangular; said magnet means comprising a linear center section and two end sections, in which said linear section is aligned along the length of said target; said linear section including a plurality of permanent magnets with magnetization oriented parallel to said target and perpendicular to the longitudinal centerline of said target; a plurality of said magnets being on each side of said target centerline; said magnets on each side of said centerline magnetized in the same direction, and in the opposite direction to said magnets on the other side of said centerline; and at least one magnetically permeable segment on each side of said centerline and disposed between said magnets.

8. A magnetron sputtering cathode as in claim 2; said target being circular; said magnetic means comprising a plurally of concentric electromagnet coils, mounted in a magnetically permeable pole piece; and a magnetically permeable segment between the electromagnet poles.

9. A magnetron sputtering cathode as in claim 8; in which said magnetically permeable segment is a part of, or attached to, said pole piece.

10. A magnetron sputtering cathode as in claim 1; said magnet means including permanent magnets comprised of neodymium-iron-boron or samarium cobalt.

11. A magnetron sputtering cathode as in claim 1; said flat area being 40% of the width of said magnet means.

12. A method of increasing the target utilization in a magnetron sputtering process wherein a glow discharge plasma is magnetically confined to a region adjacent to and above the target, said target having a front surface, a body and a back surface, comprising:

utilizing magnetic means that generate magnetic flux lines which form a closed-loop magnetic tunnel adjacent to said front surface of said target and within said target body; the curvature of said magnetic flux lines in the center of said tunnel changing progressively from concave, to flat, to convex with increasing distance from said magnet means; in the region where said magnetic flux lines are flat, the flat area is at least 20% of the width of said magnet means, is substantially parallel to said target, and is located substantially at said front surface of said target; and in the region where said magnetic flux lines are concave, said concave area is located substantially within said target body 13. The method of claim 12, wherein said flat area is at least 40% of the width of said magnet means.

14. The method of claim 12, wherein said magnet means comprises a plurality of permanent magnets, a magnetically permeable pole piece attached to said permanent magnets and a magnetically permeable segment between some of said permanent magnets.

15. The method of claim 14, wherein said permanent magnets comprise neodymium-iron-boride or samarium cobalt.

16. The method of claim 14, wherein said magnet means is adjacent to said back surface of said target.

17. The method of claim 14, wherein said target means are rectangular and said magnet means consist of a linear portion and two semicircular portions attached at the two ends of said linear portions.

18. The method of claim 14, wherein said target is circular, and said magnet means consists of circularly shaped magnets and permeable segments.

19. The method of claim 12, wherein said magnet means comprise a plurality of electromagnetic coils, and a magnetically permeable segment between the poles of said magnet means.

* * * * *